United States Patent
Niendorf et al.

(10) Patent No.: US 11,682,611 B2
(45) Date of Patent: Jun. 20, 2023

(54) POWER SEMICONDUCTOR MODULE

(71) Applicant: Infineon Technologies AG, Neubiberg (DE)

(72) Inventors: Michael Niendorf, Verl (DE); Ludwig Busch, Erwitte (DE); Oliver Markus Kreiter, Warstein (DE); Christian Neugirg, Regensburg (DE); Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 228 days.

(21) Appl. No.: 16/907,734

(22) Filed: Jun. 22, 2020

(65) Prior Publication Data
US 2021/0398887 A1    Dec. 23, 2021

(51) Int. Cl.
*H01L 23/495*      (2006.01)
*H01L 23/00*      (2006.01)

(52) U.S. Cl.
CPC .... *H01L 23/49575* (2013.01); *H01L 23/4952* (2013.01); *H01L 23/49503* (2013.01); *H01L 23/49562* (2013.01); *H01L 23/49568* (2013.01); *H01L 24/48* (2013.01); *H01L 2224/48137* (2013.01); *H01L 2924/1203* (2013.01); *H01L 2924/13055* (2013.01)

(58) Field of Classification Search
CPC ........ H01L 23/49575; H01L 23/79503; H01L 23/4952; H01L 23/49562; H01L 23/49568; H01L 24/48
See application file for complete search history.

(56) References Cited

U.S. PATENT DOCUMENTS

| | | | | |
|---|---|---|---|---|
| 2005/0035434 | A1* | 2/2005 | Fissore | H01L 25/072 257/E25.016 |
| 2006/0043545 | A1* | 3/2006 | Yea | H01L 23/49575 257/666 |
| 2012/0014059 | A1* | 1/2012 | Zeng | H01L 24/84 361/730 |
| 2021/0202439 | A1* | 7/2021 | Wu | H01L 23/492 |
| 2021/0398887 | A1 | 12/2021 | Niendorf et al. | |

\* cited by examiner

*Primary Examiner* — Marc Anthony Armand
(74) *Attorney, Agent, or Firm* — Murphy, Bilak & Homiller, PLLC

(57) ABSTRACT

A power semiconductor module includes a leadframe having a first die pad, a second die pad separated from the first die pad, a first power lead formed as an extension of the first die pad, a second power lead separated from the first and second die pads, and a first connection region formed as an extension of the second power lead alongside the second die pad. A first plurality of power semiconductor dies is attached to the first die pad and electrically coupled in parallel. A second plurality of power semiconductor dies is attached to the second die pad and electrically coupled in parallel. A first electrical connection extends between the first plurality of power semiconductor dies and the second die pad in a first direction. A second electrical connection extends between the second plurality of power semiconductor dies and the first connection region in the first direction.

22 Claims, 4 Drawing Sheets

POWER SEMICONDUCTOR MODULE

BACKGROUND

Inverter power modules have transitioned from a niche market solution to a commodity product in the automotive industry. Borrowing module and packaging concepts from preexisting products with high maturity in the product life cycle is plausible if the inverter power module complexity stays small. Without any adaptions, implementing even a simple half bridge with two power switch devices in a single package eliminates the use of established production-efficient designs, resulting in limitations of several requirements such as power and temperature ratings, switching symmetry, routing capability of signals, etc.

For realization of a half bridge using a conventional leadframe concept involves molding two single power switch devices, each having a copper substrate often called a die pad or paddle, and the corresponding driver chips (dies) and power and signal pins next to each other. The power switch devices are connected at a phase node with different methods. For example, the phase connection can be provided by a copper clip on the chip front side which results in high chip cost due to solderable frontside metallizations. In another case, the phase connection is provided by using more established bond technologies with more cost-efficient chip front side, but with limited capability/cross section to actually carry the current. Here, the bond temperature is the limiting parameter which is highly increased by the comparably large bond length needed to form the phase connection.

The large bond length is originating from a scaling effect that is described as follows. Depending on the power class and thus the amount of chips being used, established bond technologies require that the chips must be distributed in two different dimensions (e.g. the high-side switch devices in the x direction and the low-side switch devices in the y direction) to have the same amount of wires (i.e. the same cross section) available to carry the current. This results in a very limited compactness of the module. Using one large chip instead of two or separate chips to implement both the high-side switch device and the low-side switch device results in limited competitiveness due to a higher rate of solder voids which leads to increased yield loss and a less cost effective wafer yield due to larger area of unused wafer edges.

Furthermore, the temperature of the connected power pins should be carefully investigated with such concepts. Usually the power pin temperatures are strictly limited (e.g. 125° C.) so that damaging other components in the inverter, especially intermediate circuit capacitors, bus bar isolation, etc., by thermal stress is limited. Since at least one power pin must be connected directly to the chip frontside of one switch (e.g. low-side), this pin experiences a lot of heat which will exceed temperature limits without any further cooling measures, as compared to the pins that are connected to the substrate/die pad. In the case of multiple high-side and low-side dies, the low-side dies are typically rotated by 90° relative to the high-side dies in order to use the same amount of wire bonds which limits power scalability of the package since scaling must be done in two dimensions.

Thus, there is a need for a low-cost and scalable inverter power module suitable for high volume production.

SUMMARY

According to an embodiment of a power semiconductor module, the power semiconductor module comprises: a leadframe comprising a first die pad, a second die pad separated from the first die pad, a first power lead formed as an extension of the first die pad, a second power lead separated from the first and second die pads, and a first connection region formed as an extension of the second power lead alongside the second die pad; a first plurality of power semiconductor dies attached to the first die pad and electrically coupled in parallel; a second plurality of power semiconductor dies attached to the second die pad and electrically coupled in parallel; a first electrical connection extending between the first plurality of power semiconductor dies and the second die pad in a first direction; and a second electrical connection extending between the second plurality of power semiconductor dies and the first connection region in the first direction.

According to another embodiment of a power semiconductor module, the power semiconductor module comprises: a leadframe comprising a first die pad, a second die pad separated from the first die pad, a positive DC lead formed as an extension of the first die pad, a negative DC lead, a phase output lead, and a first connection region formed as an extension of the negative DC lead alongside the second die pad; a plurality of high-side power transistor dies attached to the first die pad and electrically coupled in parallel; a plurality of low-side power transistor dies attached to the second die pad and electrically coupled in parallel; a first electrical connection extending between the plurality of high-side power transistor dies and the second die pad in a first direction; and a second electrical connection extending between the plurality of low-side power transistor dies and the first connection region in the first direction, wherein the plurality of high-side power transistor dies and the plurality of low-side power transistor dies are electrically coupled in a half bridge configuration having a switching node which is accessible via the phase output lead.

Those skilled in the art recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a power semiconductor module having a connection region formed as an extension of a power lead. The power lead with the connection region extension is part of a leadframe which also includes die pads to which semiconductor dies are attached. The power lead with the connection region extension is separated from the die pads, and the connection region extension is disposed alongside one of the die pads. The connection region extension of the power lead and the die pads are arranged in a row such that all power electrical connections may be made between the dies and the leadframe in the same direction within the power semiconductor module.

The leadframe configuration described herein for power semiconductor modules breaks the symmetry of high-side and low-side switch devices by introducing at least one gap having a high aspect ratio in at least one of the module die pads. The gap is at least partly occupied by a prolonged extension of a power pin such as a DC-link pin in the case of an inverter power module. The power module arrangement described herein yields a very limited but highly effective routing capability for the leadframe-based module, and avoids a 90° rotation of low-side switch dies which results in improved power scalability of the package since scaling need only be done in one dimension. By this measure, the compactness of the module may be maximized and bond length and thus bond temperature may be reduced. Furthermore, chip scaling is possible without changing wirebond length and/or package size. Also, in the case of an inverter power module, the DC-link power pin which typically remains uncooled may now have the same connection to cooling structures as other power pins and die pads, resulting in a lower DC-link power pin temperature. Stray inductance of the module is not negatively influenced, whereas emitter coupling is now possible, as IGBTs (insulated gate bipolar transistors) may be placed near the DC-link since IGBTs are typically stacked in the same dimension.

The measures described herein are also expected to yield a significant enhancement of module performance compared to other leadframe-based half bridge solutions with bonding technology, while retaining the benefits of a highly automated and cost-effective base solution for the module. Each substrate/die pad included in the power semiconductor module may be produced from a stamped leadframe, and the chip interconnection may be done with cost-effective solutions such as Al wires for lower currents, Al ribbons, CucorAl (composite ribbon type with a copper core and aluminum coating) ribbons and/or AlCu clad ribbons for higher currents, depending on cooling solutions (dissipated chip power) of the module, etc. may be used to form some or all of the power electrical connections may be made between the dies and the leadframe within the power semiconductor module.

Figure 1:
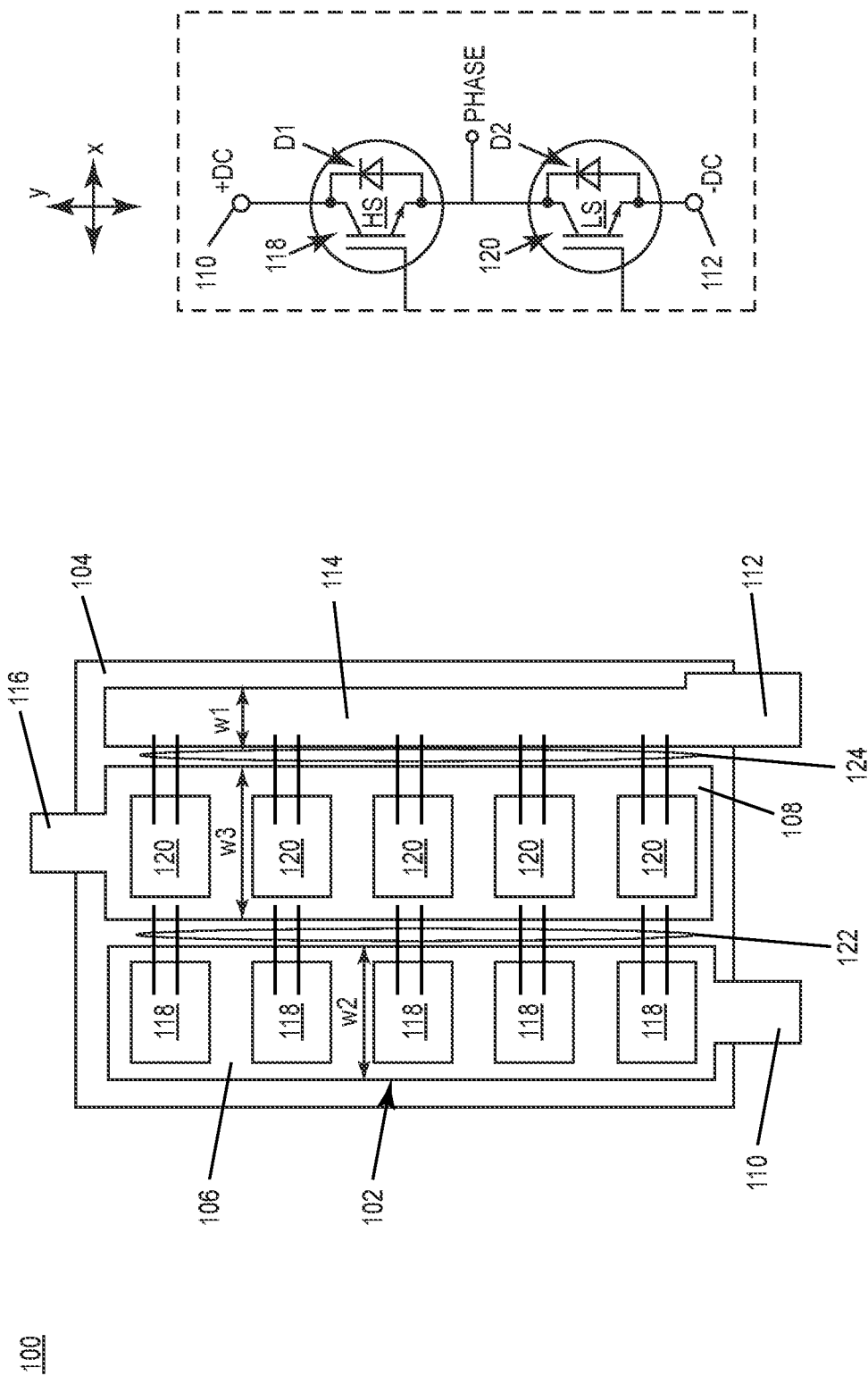
FIG. 1 illustrates a block diagram of an embodiment of a power semiconductor module.

FIG. 1 illustrates an embodiment of a power semiconductor module 100. The power semiconductor module 100 includes a leadframe 102 attached to a heat sink 104 which may be part of an active or passive cooler. For example, in the case of an inverter power module capable of delivering 300 or more amps, the heat sink 104 may be part of an active cooling system that includes a pump and radiator. In the case of a passive cooling system, the heat sink 104 may include fins or other structures for dissipating heat to the surrounding environment.

The leadframe 102 includes a first die pad (paddle) 106, a second die pad 108 separated from the first die pad 106, a first power lead 110 and a second power lead 112. The terms 'die pad' and 'die paddle' as used interchangeably herein to mean a section or region of a leadframe designed to accommodate one or more semiconductor dies.

The first power lead 110 is formed as an extension of the first die pad 106. The second power lead 112 is separated from the first and second die pads 106, 108. A first connection region 114 is formed as an extension of the second power lead 112 alongside the second die pad 108. In one embodiment, the first connection region extension 114 of the second power lead 112 is narrower than the first die pad 106 and the second die pad 108 as measured in the x direction. That is, the width (w1) of the first connection region extension 114 of the second power lead 112 is smaller than both the width (w2) of the first die pad 106 and the width (w3) of the second die pad 108.

In the case of an inverter power module capable of delivering 300 or more amps, a lead 116 may be formed as an extension of the second die pad 108 to form a phase output of the inverter. In the case of a bi-directional power converter, the lead 116 formed as an extension of the second die pad 108 of the leadframe 102 may be a phase input in one direction of power flow and a phase output in the opposite power flow direction.

The leadframe 102 may be one of several leadframes produced from the same leadframe panel which may be formed from a metal sheet. The leadframe features and structures described herein may be formed using typical techniques such as stamping, punching, etching, etc. Exemplary materials for the leadframe 102 include metals such as copper, aluminum, nickel, iron, zinc, etc., and alloys thereof.

The power semiconductor module 100 further includes first power semiconductor dies 118 attached to the first die pad 106 and electrically coupled in parallel. Second power semiconductor dies 120 are attached to the second die pad 120 and electrically coupled in parallel. The power semiconductor dies 118, 120 may be power transistor dies such as power MOSFET (metal-oxide-semiconductor field effect transistor) dies, IGBT (insulated gate bipolar transistor) dies, HEMT (high-electron mobility transistor) dies, etc. The power semiconductor dies 118, 120 instead may be power diode dies. In either case, and as shown in FIG. 1, the power semiconductor dies 118, 120 may be vertical devices in that the primary current flow path is vertical between one main (top/bottom) surface of the respective dies 118, 120 to the opposite main (bottom/top) die surface. The heat sink 104 attached to the leadframe 102 is thermally coupled to and electrically insulated from the first die pad 106, the second die pad 108 and the first connection region extension 114 of the second power lead 112 at a side of the leadframe 102 which faces away from the power semiconductor dies 118, 120. The electrical isolation between the heat sink 104 and the leadframe 102 may be provided by a low thermal resistance isolation layer that encapsulates the exposed bottom surface of the leadframe 102. In another example, an organic foil with a copper layer may be applied to the exposed bottom surface of the leadframe 102 and a thermal interface material applied to the copper layer. In yet another example, an organic foil may be applied to the exposed bottom surface of the leadframe 102 and the heat sink 104 contacts the organic foil.

The connection region extension 114 of the second power lead 112 may be attached to the heat sink 104, providing for direct cooling of the second power lead 112 which, e.g., may be the negative (−) DC link terminal in an inverter configuration. The first power transistor dies 118 are attached to the first die pad 106 in a first row aligned with the length and perpendicular to the width w2 of the first die pad 106, the second power transistor dies 120 may be attached to the second die pad 108 in a second row parallel to the first row and aligned with the length and perpendicular to the width w3 of the second die pad 108, and the connection region extension 114 of the second power lead 112 may extend lengthwise perpendicular to the width w1 of the connection region extension 114 and in a direction (y) parallel to the first and the second rows of power semiconductor dies 118, 120.

The power semiconductor module 100 also includes a first electrical connection 122 extending between the first power semiconductor dies 118 and the second die pad 108 in a first (x) direction. A second electrical connection 124 extends between the second power semiconductor dies 120 and the connection region extension 114 of the second power lead 112 in the same first direction (x) as the first electrical connection 122, avoiding a 90° rotation of the second power semiconductor dies 120. Accordingly, the power connections to the power semiconductor dies 118, 120 provided by the first and second electrical connections 122, 124 are orientated in the same (x) direction. The first and second electrical connections 122, 124 are schematically illustrated in FIG. 1, provide power connections, and may be implemented as ribbon bonds, wire bonds, metal clips, etc. The first and second electrical connections 122, 124 are considered power connections in that they deliver inverter or converter voltage potentials and/or carry substantial current as opposed, e.g., to transistor gate connections which are not shown but provide gate potential and carry negligible current.

In the case of an inverter power module capable of delivering 300 or more amps, the first and second electrical connections 122, 124 may couple the first and second power semiconductor dies 118, 120 in a half bridge configuration with a phase input-output, as schematically illustrated by the dashed box included in FIG. 1.

In a half bridge configuration, the high-side switch device HS includes the parallel-coupled first power semiconductor dies 118 with corresponding antiparallel connected diodes D1. The low-side switch device LS similarly includes the parallel-coupled second power semiconductor dies 120 with corresponding antiparallel connected diodes D2. In some cases, the respective antiparallel connected diodes D1, D2 may be integrated in each corresponding die 118, 120. In other cases, the respective antiparallel connected diodes D1, D2 may be discrete dies attached to the same die pad 106, 108 as the corresponding set of parallel-coupled power semiconductor dies 118, 120. The lead 116 formed as an extension of the second die pad 108 provides the phase input/output to the half bridge. The first power lead 110 provides the positive (+) DC link connection for the half bridge and the second power lead 112 provides the negative (−) DC link connection.

More than one half bridge may be provided in the power semiconductor module 100, e.g., by replicating the half bridge configuration shown in FIG. 1, or other types of inverter or converter topologies may be implemented such as full bridge, DC-to-AC converter, reversible DC motor drive, three or higher-phase bridge, buck converter, boost converter, synchronous rectifier, etc. The power semiconductor module 100 may be encapsulated, e.g., in a mold compound, a lid may be attached to the power semiconductor module 100, the power semiconductor module 100 may be placed in a housing, etc. Regardless of the final disposition of the power semiconductor module 100, the connection region extension 114 of the second power lead 112 and the die pads 106, 108 are arranged in a row such that the electrical connections 122, 124 which connect the power semiconductor dies 118, 120 in the intended configuration are made between the dies 118, 120 and the leadframe 102 in the same direction (x) within the power semiconductor module 100.

Figure 2:
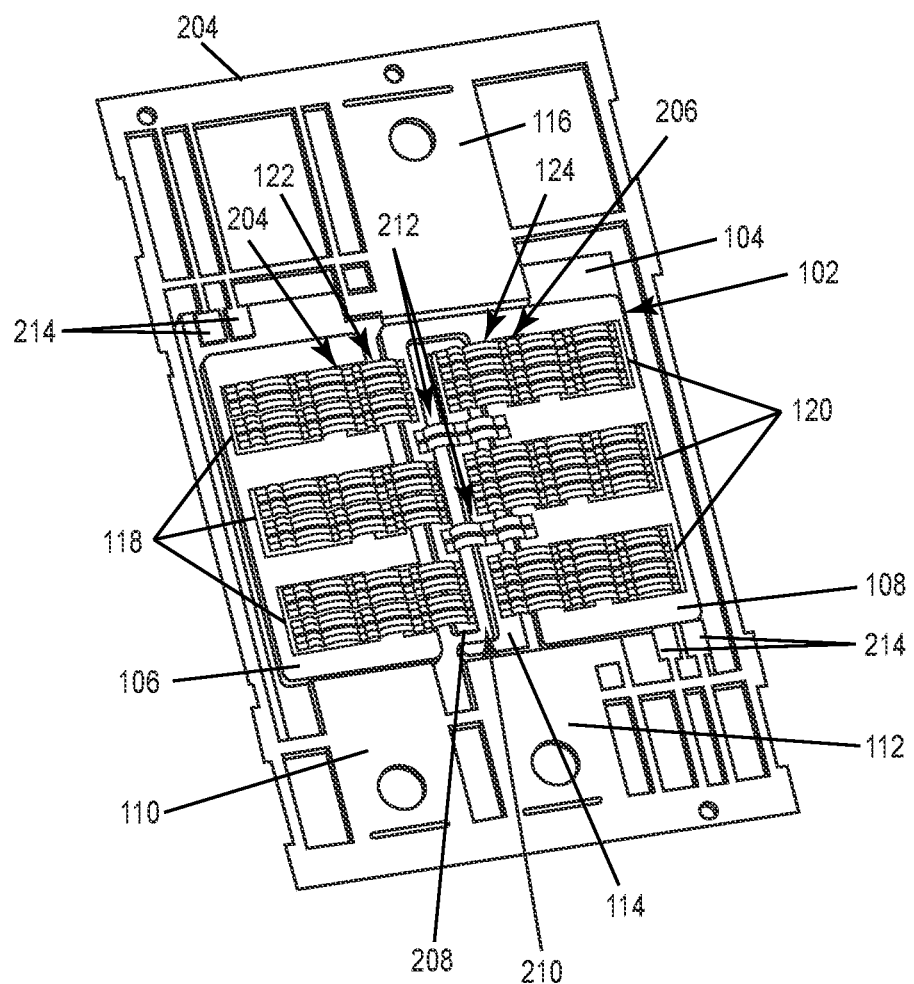
FIG. 2 illustrates a perspective view of an embodiment of a power semiconductor module.

FIG. 2 illustrates another embodiment of a power semiconductor module 200. Unlike the power semiconductor module 100 in FIG. 1, the leadframe 102 has yet to be severed from the leadframe panel 202 in FIG. 2. Only a portion of the leadframe panel 202 is shown in FIG. 2. Depending on the type of configuration, the power semiconductor module 200 may include additional semiconductor dies 204, 206 such as capacitor and/or diode dies attached to the respective dies pads 106, 108. For example, in the case of the first and second power semiconductor dies 118, 120 being IGBT dies, first power diode dies 204 may be attached to the first die pad 106 and electrically coupled antiparallel with the first IGBT dies 118 via the first die pad 106 and the first electrical connection 122. Second power diode dies 206 may be attached to the second die pad 108 and electrically coupled antiparallel with the second IGBT dies 120 via the second die pad 108 and the second electrical connection 124.

In FIG. 2, the first and second electrical connections 122, 124 are shown as ribbon bonds. However, the first and second electrical connections 122, 124 may instead be implemented as another type of power connection such as wire bonds, metal clips, etc.

As shown in FIG. 2, the connection region extension 114 of the second power lead 112 may be interposed between the first die pad 106 and the second die pad 108 in the same row. According to an embodiment, an additional connection region 208 is formed as an extension of the second die pad 108. The electrical connection 122 extending between the first power semiconductor dies 118 and the second die pad 108 may contact the connection region extension 208 of the second die pad 108. The connection region extension 114 of the second power lead 112 may be disposed in a gap 210 between the second die pad 108 and the connection region extension 208 of the second die pad 108 in an interleaved manner. Additional power connections 212 may be provided between the second die pad 108 and the connection region extension 208 of the second die pad 108. The leadframe 102 may include additional leads 214 for providing gate connections in the case of power transistors as the power semiconductor dies 118, 120, telemetry connections, sensing connections, etc.

Figure 3:
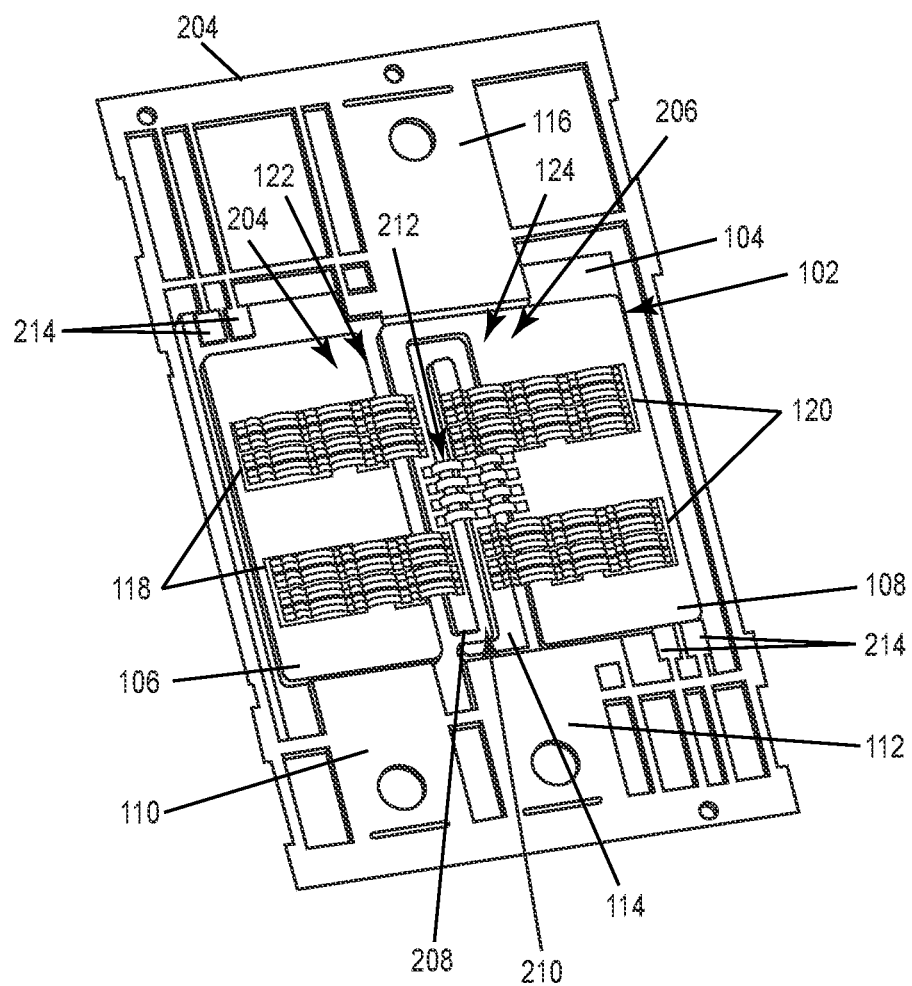
FIG. 3 illustrates a perspective view of another embodiment of a power semiconductor module.

FIG. 3 illustrates another embodiment of a power semiconductor module 300. The embodiments shown in FIGS. 2 and 3 emphasize that the power module scaling flexibility provided by the leadframe configuration described herein. The number and type/size (area) of the semiconductor dies 118, 120 included in the power semiconductor module 300 may be easily scaled without adversely affecting the power module layout and footprint, allowing for power module compatibility across different system designs and applications.

Figure 4:
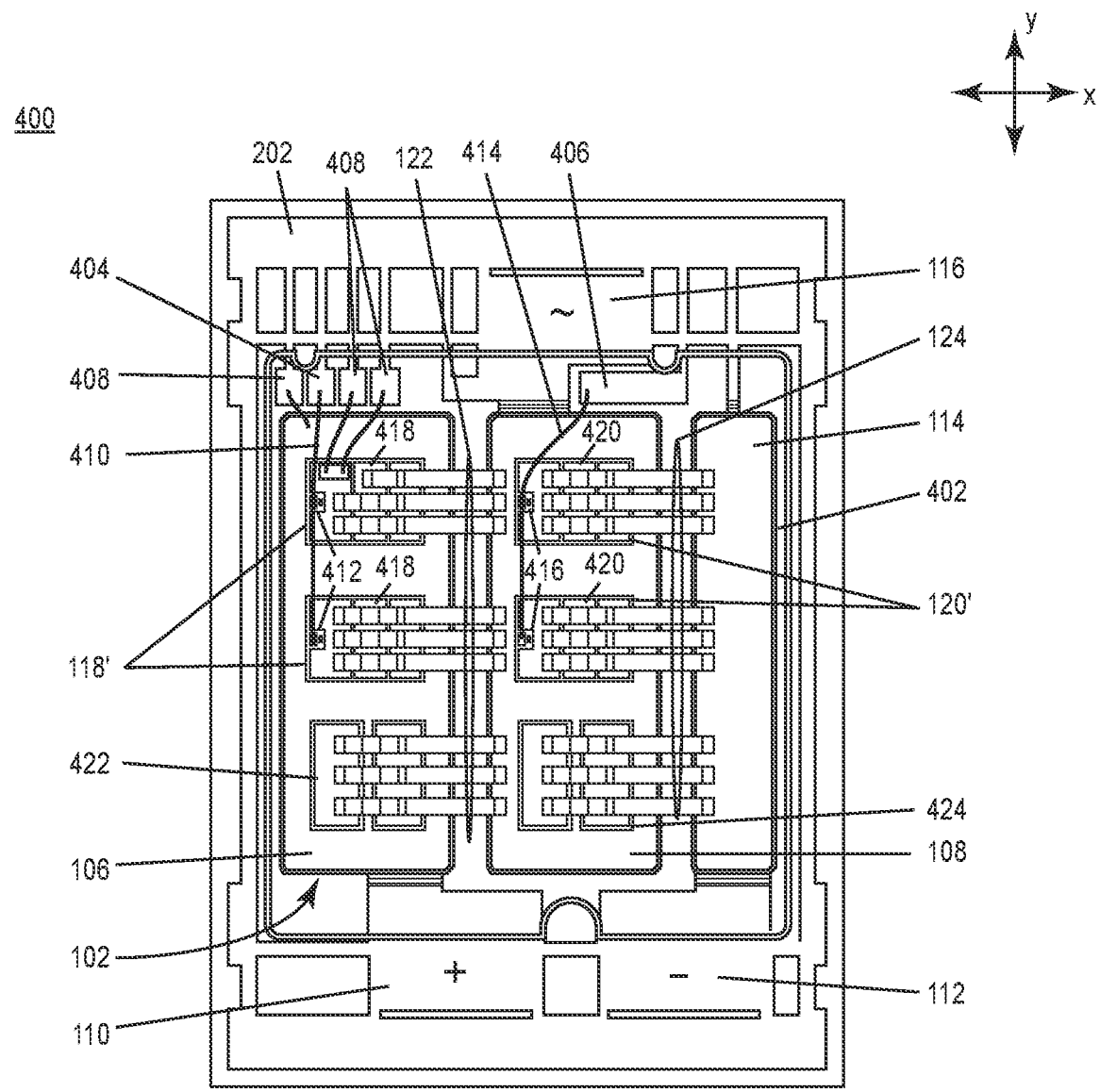
FIG. 4 illustrates a block diagram of another embodiment of a power semiconductor module.

FIG. 4 illustrates another embodiment of a power semiconductor module 400. As in FIGS. 2 and 3, the leadframe 102 has yet to be severed from the leadframe panel 202 in FIG. 4 and only a portion of the leadframe panel 202 is illustrated. FIG. 4 also shows the outline of an encapsulant 402 such as a mold compound which encases the power semiconductor dies 118, 120 and part of the leadframe 102. Different than the power semiconductor modules 200, 300 in FIGS. 2 and 3 and similar to the power semiconductor module 100 in FIG. 1, the second die pad 108 is interposed between the first die pad 106 and the connection region extension 114 of the second power lead 112 in FIG. 4.

According to the embodiment illustrated in FIG. 4, the power semiconductor module 400 is an inverter power module capable of delivering 300 or more amps and having a positive (+) DC link voltage input, a negative (−) DC link voltage input and a phase (−) output. The first power semiconductor dies 118 include high-side power transistor dies 118' attached to the first die pad 106 and electrically coupled in parallel and the second power semiconductor dies 120 include low-side power transistor dies 120' attached to the second die pad 108 and electrically coupled in parallel. The first electrical connection 122 extends between the high-side power transistor dies 118' and the second die pad 108 in a first direction (x). The second electrical connection 124 extends between the low-side power transistor dies 1210' and the connection region extension 114 of the second power lead 112 in the first direction (x). The high-side power transistor dies 118' and the low-side power transistor dies 120' are electrically coupled in a half bridge configuration having a switching node which is accessible via the phase (~) lead 116 of the leadframe 102. In FIG. 4, the first and second electrical connections 122, 124 are shown as ribbon bonds. However, the first and second electrical connections 122, 124 may instead be implemented as another type of power connection such as wire bonds, metal clips, etc.

The leadframe 102 also includes a first gate lead 404 and a second gate lead 406. The leadframe 102 may include additional leads 408 for providing telemetry connections, sensing connections, etc. A third electrical connection 410 is provided between the first gate lead 404 of the leadframe 102 and a gate terminal 412 of each high-side power transistor die 118'. A fourth electrical connection 414 is provided between the second gate lead 406 of the leadframe 102 and a gate terminal 416 of each low-side power transistor die 120'. The third electrical connection 410 extends perpendicular with respect to the first electrical connection 122 at least between the gate terminals 412 of the high-side power transistor dies 118'. The fourth electrical connection 414 also extends perpendicular with respect to the second electrical connection 124 at least between the gate terminals 416 of the low-side power transistor dies 120'.

Providing a gate connection for several parallel-coupled dies via the same connection may result in gate voltage drop due to mutual induction. In the case of parallel coupled IGBT dies, if a 90 degree (perpendicular) orientation is provided between the gate loop connection 410/414 and the corresponding emitter loop connection 122/124 as shown in FIG. 4, the gate voltage applied to all parallel coupled IGBTs 118'/120' is the same. Some voltage drop may occur due to switching behavior, but each parallel coupled IGBT die 118'/120' sees the same or nearly the same gate voltage because inductivity produced by the emitter loop connection 122/124 is oriented 90 degrees with respect to the corresponding gate loop connection 410/414 as shown in FIG. 4, and therefore losses arising due to mutual induction are minimized. If instead the gate and emitter loop connections were parallel to one another, the second parallel-coupled IGBT die in the chain sees 20% less gate voltage, the third parallel-coupled IGBT die sees 60% less gate voltage, etc. At least one of the parallel-coupled IGBT dies is likely to not receive an adequate gate voltage for turning on, which is prevented by the 90 degree (perpendicular) orientation between the first and third electrical connections 122, 410 and between the second and fourth electrical connections 124, 414 shown in FIG. 4.

The perpendicular orientation of the third and fourth electrical connections 410, 414 is not necessarily maintained over the entire length of the respective gate connections 410, 414. For example, as shown in FIG. 4, the third electrical connection 410 which provides the high-side gate connection may bend between the corresponding gate lead 404 and the high-side power transistor dies 118' but remains straight between the gate terminals 412 of the high-side power transistor dies 118'. The fourth electrical connection 414 which provides the low-side gate connection may also bend between the corresponding gate lead 406 and the low-side power transistor dies 120' but remains straight between the gate terminals 416 of the low-side power transistor dies 120'. In FIG. 4, the third and fourth electrical connections 410, 414 are shown as wire bonds. However, the third and fourth electrical connections 410, 414 may instead be implemented as another type of power connection such as ribbon bonds, metal clips, etc.

In one embodiment, the high-side power transistor dies 118' and the low-side power transistor dies 120' are IGBT dies. In this case, the collector terminal (out of view) of each high-side power transistor die 118' is attached to the first die pad 106 and thus to a positive (+) DC link voltage via the first power lead 110. The collector terminal (out of view) of each low-side power transistor dies 120' is attached to the second die pad 108. The emitter terminal 418 of each high-side power transistor die 118' is coupled to the second die pad 108 of the leadframe 102 through the first electrical connection 122 to form the phase input/output (~) of the half bridge at lead 116. The emitter terminal 420 of each high-side power transistor die 118' is coupled to the connection region extension 114 of the second power lead 112 through the second electrical connection 124 and thus to a negative (−) DC link voltage via the second power lead 112.

In the case of IGBT power transistor dies 118', 120', the power semiconductor module 400 may also include high-side power diode dies 422 and low-side power diode dies 424. The high-side power diode dies 422 are attached to the first die pad 106 and electrically coupled antiparallel with the high-side IGBT dies 118' via the first die pad 106 and the first electrical connection 122. The low-side power diode dies 424 are attached to the second die pad 108 and electrically coupled antiparallel with the low-side IGBT dies 120' via the second die pad and the second electrical connection. In other inverter implementations, the diode functionality may be integrated in the respective power transistor dies 118', 120'. The heat sink 104 illustrated in FIGS. 1 through 3 is out of view in FIG. 4, and may be omitted, e.g., if a separate system-level cooling system is provided later.

Although the present disclosure is not so limited, the following numbered examples demonstrate one or more aspects of the disclosure.

Example 1. A power semiconductor module, comprising: a leadframe comprising a first die pad, a second die pad separated from the first die pad, a first power lead formed as an extension of the first die pad, a second power lead separated from the first and second die pads, and a first connection region formed as an extension of the second power lead alongside the second die pad; a first plurality of power semiconductor dies attached to the first die pad and electrically coupled in parallel; a second plurality of power semiconductor dies attached to the second die pad and electrically coupled in parallel; a first electrical connection extending between the first plurality of power semiconductor dies and the second die pad in a first direction; and a second electrical connection extending between the second plurality of power semiconductor dies and the first connection region in the first direction.

Example 2. The power semiconductor module of example 1, wherein the first die pad, the second die pad and the first connection region are disposed in a row, and wherein the second die pad is interposed between the first die pad and the first connection region.

Example 3. The power semiconductor module of example 1, wherein the first die pad, the second die pad and the first connection region are disposed in a row, and wherein the first connection region is interposed between the first die pad and the second die pad.

Example 4. The power semiconductor module of examples 1 through 3, wherein a second connection region is formed as an extension of the second die pad, wherein the first electrical connection contacts the second connection region, and wherein the first connection region is disposed in a gap between the second die pad and the second connection region.

Example 5. The power semiconductor module of any of examples 1 through 4, wherein the first plurality of power semiconductor dies comprises first power transistor dies, wherein the second plurality of power semiconductor dies comprises second power transistor dies, wherein the first power transistor dies and the second power transistor dies are electrically coupled in a half bridge configuration, and wherein the leadframe further comprises a first gate lead, a second gate lead and an output lead formed as an extension of the second die pad.

Example 6. The power semiconductor module of example 5, further comprising: a third electrical connection between the first gate lead of the leadframe and a gate terminal of each first power transistor die; and a fourth electrical connection between the second gate lead of the leadframe and a gate terminal of each second power transistor die, wherein the third electrical connection extends perpendicular with respect to the first electrical connection between the gate terminals of the first power transistor dies, wherein the fourth electrical connection extends perpendicular with respect to the second electrical connection between the gate terminals of the second power transistor dies.

Example 7. The power semiconductor module of example 5 or 6, wherein the first power transistor dies are attached to the first die pad in a first row, wherein the second power transistor dies are attached to the second die pad in a second row parallel to the first row, and wherein the first connection region of the second power lead extends lengthwise in a direction parallel to the first and the second rows.

Example 8. The power semiconductor module of any of examples 1 through 4, wherein the first plurality of power semiconductor dies comprises first power diode dies, and wherein the second plurality of power semiconductor dies comprises second power diode dies.

Example 9. The power semiconductor module of any of examples 1 through 8, wherein the first electrical connection comprises a plurality of first ribbon bonds, and wherein the second electrical connection comprises a plurality of second ribbon bonds.

Example 10. The power semiconductor module of examples 1 through 4 and 9, wherein the first plurality of power semiconductor dies comprises first IGBT (insulated gate bipolar transistor) dies, wherein the second plurality of power semiconductor dies comprises second IGBT dies, and wherein the power semiconductor module further comprises: a first plurality of power diode dies attached to the first die pad and electrically coupled antiparallel with the first IGBT dies via the first die pad and the first electrical connection; and a second plurality of power diode dies attached to the second die pad and electrically coupled antiparallel with the second IGBT dies via the second die pad and the second electrical connection.

Example 11. The power semiconductor module of any of examples 1 through 10, further comprising: a heat sink thermally coupled to and electrically insulated from the first die pad, the second die pad and the first connection region at a side of the leadframe which faces away from the power semiconductor dies.

Example 12. The power semiconductor module of any of examples 1 through 11, wherein the first connection region is narrower than the first die pad and the second die pad as measured in the first direction.

Example 13. A power semiconductor module, comprising: a leadframe comprising a first die pad, a second die pad separated from the first die pad, a positive DC lead formed as an extension of the first die pad, a negative DC lead, a phase output lead, and a first connection region formed as an extension of the negative DC lead alongside the second die pad; a plurality of high-side power transistor dies attached to the first die pad and electrically coupled in parallel; a plurality of low-side power transistor dies attached to the second die pad and electrically coupled in parallel; a first electrical connection extending between the plurality of high-side power transistor dies and the second die pad in a first direction; and a second electrical connection extending between the plurality of low-side power transistor dies and the first connection region in the first direction, wherein the plurality of high-side power transistor dies and the plurality of low-side power transistor dies are electrically coupled in a half bridge configuration having a switching node which is accessible via the phase output lead.

Example 14. The power semiconductor module of example 13, wherein the first die pad, the second die pad and the first connection region are disposed in a row, and wherein the second die pad is interposed between the first die pad and the first connection region.

Example 15. The power semiconductor module of example 13, wherein the first die pad, the second die pad and the first connection region are disposed in a row, and wherein the first connection region is interposed between the first die pad and the second die pad.

Example 16. The power semiconductor module of any of examples 13 through 15, wherein a second connection region is formed as an extension of the second die pad, wherein the first electrical connection contacts the second connection region, and wherein the first connection region is disposed in a gap between the second die pad and the second connection region.

Example 17. The power semiconductor module of any of examples 13 through 16, further comprising: a third electrical connection between a first gate lead of the leadframe and a gate terminal of each high-side power transistor die; and a fourth electrical connection between a second gate lead of the leadframe and a gate terminal of each low-side power transistor die, wherein the third electrical connection extends perpendicular with respect to the first electrical connection between the gate terminals of the high-side power transistor dies, wherein the fourth electrical connection extends perpendicular with respect to the second electrical connection between the gate terminals of the low-side power transistor dies.

Example 18. The power semiconductor module of any of examples 13 through 17, wherein the first electrical connection comprises a plurality of first ribbon bonds, and wherein the second electrical connection comprises a plurality of second ribbon bonds.

Example 19. The power semiconductor module of any of examples 13 through 18, wherein the plurality of high-side power transistor dies comprises first IGBT (insulated gate bipolar transistor) dies, wherein the plurality of low-side power transistor dies comprises second IGBT dies, and wherein the power semiconductor module further comprises: a first plurality of power diode dies attached to the first die pad and electrically coupled antiparallel with the first IGBT dies via the first die pad and the first electrical connection; and a second plurality of power diode dies attached to the second die pad and electrically coupled antiparallel with the second IGBT dies via the second die pad and the second electrical connection.

Example 20. The power semiconductor module of any of examples 13 through 19, further comprising: a heat sink thermally coupled to and electrically insulated from the first die pad, the second die pad and the first connection region at a side of the leadframe which faces away from the high-side and low-side power transistor dies.

Example 21. The power semiconductor module of any of examples 13 through 20, wherein the first connection region is narrower than the first die pad and the second die pad as measured in the first direction.

Example 22. The power semiconductor module of any of examples 13 through 21, wherein the high-side power transistor dies are attached to the first die pad in a first row, wherein the low-side power transistor dies are attached to the second die pad in a second row parallel to the first row, and wherein the first connection region of the negative DC lead extends lengthwise in a direction parallel to the first and the second rows.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:
   a leadframe comprising a first die pad, a second die pad separated from the first die pad, a first power lead formed as an extension of the first die pad, a second power lead separated from the first and second die pads, and a first connection region formed as an extension of the second power lead alongside the second die pad;
   a first plurality of power semiconductor dies attached to the first die pad and electrically coupled in parallel;
   a second plurality of power semiconductor dies attached to the second die pad and electrically coupled in parallel;
   a first electrical connection extending between the first plurality of power semiconductor dies and the second die pad in a first direction; and
   a second electrical connection extending between the second plurality of power semiconductor dies and the first connection region in the first direction.

2. The power semiconductor module of claim 1, wherein the first die pad, the second die pad and the first connection region are disposed in a row, and wherein the second die pad is interposed between the first die pad and the first connection region.

3. The power semiconductor module of claim 1, wherein the first die pad, the second die pad and the first connection region are disposed in a row, and wherein the first connection region is interposed between the first die pad and the second die pad.

4. The power semiconductor module of claim 1, wherein a second connection region is formed as an extension of the second die pad, wherein the first electrical connection contacts the second connection region, and wherein the first connection region is disposed in a gap between the second die pad and the second connection region.

5. The power semiconductor module of claim 1, wherein the first plurality of power semiconductor dies comprises first power transistor dies, wherein the second plurality of power semiconductor dies comprises second power transistor dies, wherein the first power transistor dies and the second power transistor dies are electrically coupled in a half bridge configuration, and wherein the leadframe further comprises a first gate lead, a second gate lead and an output lead formed as an extension of the second die pad.

6. The power semiconductor module of claim 5, further comprising:
   a third electrical connection between the first gate lead of the leadframe and a gate terminal of each first power transistor die; and
   a fourth electrical connection between the second gate lead of the leadframe and a gate terminal of each second power transistor die,
   wherein the third electrical connection extends perpendicular with respect to the first electrical connection between the gate terminals of the first power transistor dies,
   wherein the fourth electrical connection extends perpendicular with respect to the second electrical connection between the gate terminals of the second power transistor dies.

7. The power semiconductor module of claim 5, wherein the first power transistor dies are attached to the first die pad in a first row, wherein the second power transistor dies are attached to the second die pad in a second row parallel to the first row, and wherein the first connection region of the second power lead extends lengthwise in a direction parallel to the first and the second rows.

8. The power semiconductor module of claim 1, wherein the first plurality of power semiconductor dies comprises first power diode dies, and wherein the second plurality of power semiconductor dies comprises second power diode dies.

9. The power semiconductor module of claim 1, wherein the first electrical connection comprises a plurality of first ribbon bonds, and wherein the second electrical connection comprises a plurality of second ribbon bonds.

10. The power semiconductor module of claim 1, wherein the first plurality of power semiconductor dies comprises first IGBT (insulated gate bipolar transistor) dies, wherein the second plurality of power semiconductor dies comprises second IGBT dies, and wherein the power semiconductor module further comprises:

a first plurality of power diode dies attached to the first die pad and electrically coupled antiparallel with the first IGBT dies via the first die pad and the first electrical connection; and a second plurality of power diode dies attached to the second die pad and electrically coupled antiparallel with the second IGBT dies via the second die pad and the second electrical connection.

11. The power semiconductor module of claim 1, further comprising:

a heat sink thermally coupled to and electrically insulated from the first die pad, the second die pad and the first connection region at a side of the leadframe which faces away from the power semiconductor dies.

12. The power semiconductor module of claim 1, wherein the first connection region is narrower than the first die pad and the second die pad as measured in the first direction.

13. A power semiconductor module, comprising:

a leadframe comprising a first die pad, a second die pad separated from the first die pad, a positive DC lead formed as an extension of the first die pad, a negative DC lead, a phase output lead, and a first connection region formed as an extension of the negative DC lead alongside the second die pad;

a plurality of high-side power transistor dies attached to the first die pad and electrically coupled in parallel;

a plurality of low-side power transistor dies attached to the second die pad and electrically coupled in parallel;

a first electrical connection extending between the plurality of high-side power transistor dies and the second die pad in a first direction; and a second electrical connection extending between the plurality of low-side power transistor dies and the first connection region in the first direction, wherein the plurality of high-side power transistor dies and the plurality of low-side power transistor dies are electrically coupled in a half bridge configuration having a switching node which is accessible via the phase output lead.

14. The power semiconductor module of claim 13, wherein the first die pad, the second die pad and the first connection region are disposed in a row, and wherein the second die pad is interposed between the first die pad and the first connection region.

15. The power semiconductor module of claim 13, wherein the first die pad, the second die pad and the first connection region are disposed in a row, and wherein the first connection region is interposed between the first die pad and the second die pad.

16. The power semiconductor module of claim 13, wherein a second connection region is formed as an extension of the second die pad, wherein the first electrical connection contacts the second connection region, and wherein the first connection region is disposed in a gap between the second die pad and the second connection region.

17. The power semiconductor module of claim 13, further comprising:

a third electrical connection between a first gate lead of the leadframe and a gate terminal of each high-side power transistor die; and a fourth electrical connection between a second gate lead of the leadframe and a gate terminal of each low-side power transistor die, wherein the third electrical connection extends perpendicular with respect to the first electrical connection between the gate terminals of the high-side power transistor dies, wherein the fourth electrical connection extends perpendicular with respect to the second electrical connection between the gate terminals of the low-side power transistor dies.

18. The power semiconductor module of claim 13, wherein the first electrical connection comprises a plurality of first ribbon bonds, and wherein the second electrical connection comprises a plurality of second ribbon bonds.

19. The power semiconductor module of claim 13, wherein the plurality of high-side power transistor dies comprises first IGBT (insulated gate bipolar transistor) dies, wherein the plurality of low-side power transistor dies comprises second IGBT dies, and wherein the power semiconductor module further comprises:

a first plurality of power diode dies attached to the first die pad and electrically coupled antiparallel with the first IGBT dies via the first die pad and the first electrical connection; and a second plurality of power diode dies attached to the second die pad and electrically coupled antiparallel with the second IGBT dies via the second die pad and the second electrical connection.

20. The power semiconductor module of claim 13, further comprising:

a heat sink thermally coupled to and electrically insulated from the first die pad, the second die pad and the first connection region at a side of the leadframe which faces away from the high-side and low-side power transistor dies.

21. The power semiconductor module of claim 13, wherein the first connection region is narrower than the first die pad and the second die pad as measured in the first direction.

22. The power semiconductor module of claim 13, wherein the high-side power transistor dies are attached to the first die pad in a first row, wherein the low-side power transistor dies are attached to the second die pad in a second row parallel to the first row, and wherein the first connection region of the negative DC lead extends lengthwise in a direction parallel to the first and the second rows.

* * * * *